(12) United States Patent
Von Saldern et al.

(10) Patent No.: US 8,673,179 B2
(45) Date of Patent: Mar. 18, 2014

(54) SCINTILLATION MATERIALS OF LOW OXYGEN CONTENT AND PROCESS FOR PRODUCING SAME

(75) Inventors: Johann-Christoph Von Saldern, Jena (DE); Christoph Seitz, Jena (DE); Lutz Parthier, Kleinmachnow (DE); Jochen Alkemper, Klein-Winterheim (DE)

(73) Assignee: Hellma Materials GmbH, Jena (DE)

( * ) Notice: Subject to any disclaimer, the term of this patent is extended or adjusted under 35 U.S.C. 154(b) by 628 days.

(21) Appl. No.: 12/899,948

(22) Filed: Oct. 7, 2010

(65) Prior Publication Data

US 2011/0084234 A1  Apr. 14, 2011

Related U.S. Application Data

(60) Provisional application No. 61/250,115, filed on Oct. 9, 2009.

(51) Int. Cl.
*C09K 11/08* (2006.01)
*C09K 11/61* (2006.01)

(52) U.S. Cl.
USPC .................................................. 252/301.4 H

(58) Field of Classification Search
USPC .................................................. 252/301.4 H
See application file for complete search history.

(56) References Cited

U.S. PATENT DOCUMENTS

| | | | |
|---|---|---|---|
| 3,163,608 A | 12/1964 | Yocom | |
| 3,373,279 A | 3/1968 | Hofstaedter | |
| 4,566,987 A | 1/1986 | Gliemeroth et al. | |
| 4,835,398 A | 5/1989 | Nakamura | |
| 7,067,816 B2 | 6/2006 | Dorenbos et al. | |
| 7,084,403 B2 * | 8/2006 | Srivastava et al. | 250/361 R |
| 7,364,620 B2 | 4/2008 | Jones | |
| 7,405,404 B1 | 7/2008 | Shah | |
| 7,608,828 B2 * | 10/2009 | Yoshikawa et al. | 250/361 R |
| 7,670,578 B2 * | 3/2010 | Iltis | 423/263 |
| 2005/0061982 A1 | 3/2005 | Ichinose et al. | |
| 2008/0011953 A1 | 1/2008 | Srivastava et al. | |
| 2008/0067391 A1 | 3/2008 | Shimizu et al. | |

FOREIGN PATENT DOCUMENTS

| | | |
|---|---|---|
| DE | 255 246 | 3/1988 |
| DE | 11 2005 002 674 | 3/2009 |
| EP | 1 930 394 | 6/2008 |
| EP | 1 930 395 | 6/2008 |
| GB | 2 423 771 | 9/2006 |

OTHER PUBLICATIONS

Nerine J. Cherepy et al: "Strontium and Barium Iodide . . ." in Applied Physics Letters 92, 083508, 2008, American Institute of Physics.
Alexander S. Potapov et al: "Effect of Various Impurities on Luminescent Properties . . ." Sixth International Workshop on Nondestructive Testing and Computer Simulations in Science and Engineering, Jun. 10-16, 2002, St, Petersburg, Russia, BD. 5127, Jun. 2002, pp. 44-47 (in English).
Churilov A V et al: "Modeling and Crystal Growth of Semi-Transparent . . ." Journal of Crystal Growth, Elsevier, Amsterdam, NL, BD. 310, No. 7-9, Apr. 1, 2008, pp. 2094-2098 (in English).
Higgins W M et al: "Crystal Growth of Large Diameter . . ." Journal of Crystal Growth, Elsevier, Amsterdam, NL, BD. 310, No. 7-9, Apr. 1, 2008, pp. 2085-2089 (in English).
Van Loef E V D et al: "High-Energy-Resolution Scintillator . . ." Applied Physics Letters, AIP, Alerican Institue of Physics, Melville, NY, US, BD. 79, No. 10, Sep. 3, 2001, pp. 1573-1575 (in English).

* cited by examiner

*Primary Examiner* — Carol M Koslow
*Assistant Examiner* — Matthew E Hoban
(74) *Attorney, Agent, or Firm* — Hudak, Shunk & Farine Co., LPA

(57) ABSTRACT

The scintillation material has a maximum oxygen content of 2,500 ppm and is a compound of formula $LnX_3$ or $LnX_3$:D, wherein Ln is at least one rare earth element, X is F, Cl, Br, or I; and D is at least one cationic dopant of one or more of the elements Y, Zr, Pd, Hf and Bi and, if present, is present in an amount of 10 ppm to 10,000 ppm. The process of making the scintillation material includes optionally mixing the compound of the formula $LnX_3$ with the at least one cationic dopant, heating the compound or the mixture so obtained to a melting temperature to form a melt, adding one or more carbon halides and then cooling the melt to form a crystal or crystalline structure. The maximum oxygen content of the scintillation material is preferably 1000 ppm.

2 Claims, No Drawings

SCINTILLATION MATERIALS OF LOW OXYGEN CONTENT AND PROCESS FOR PRODUCING SAME

CROSS-REFERENCE

The invention claimed and described herein below is also described in U.S. Provisional Application 61/250,115, filed on Oct. 9, 2009. The aforesaid U.S. Provisional Application, whose entire subject matter is incorporated by explicit reference thereto, provides the basis for a claim of priority of invention for the invention described and claimed herein below under 35 U.S.C. 119 (e).

The invention claimed and described herein below is related to the respective inventions described in copending U.S. patent application Ser. No. 12/899,937, in copending U.S. patent application Ser. No. 12/899,956, and in copending U.S. patent application Ser. No. 12/899,927, all of which were filed on Oct. 7, 2010.

BACKGROUND OF THE INVENTION

The present invention relates to a scintillation material with defined oxygen content and to a process for the production thereof. In particular, the scintillation material of the present invention is characterized by its manufacturing process, so that the following description also refers to this process, although the invention is a material as such.

The scintillation material according to the invention has advantageous properties. In particular, the detection properties of the scintillation material produced according to the invention are improved.

Moreover, particular embodiments of the invention also exhibit an advantageous strain birefringence (SBR) and a high homogeneity of the refractive index (HOM).

The process according to the invention also makes it possible to produce a scintillation material, which in addition to the aforementioned positive properties also exhibits particularly great mechanical ruggedness. Namely, special processes according to the invention make it possible to use suitable dopants in the scintillation material. Such materials represent particularly special embodiments of the invention.

Prior art halide-based scintillation materials have the disadvantage that during their production water and oxygen stemming either from the processed raw materials or from the environment form oxyhalides in the melt, which cause strains in the material during the crystallization. These undesirable strains are due to precipitates that form during the crystallization process and that exert a considerable negative influence on the mechanical properties of the material. In particular, the prior art scintillation materials have a tendency to fracture. Moreover, a decisive parameter of the material, namely the light yield or light output, is reduced.

Furthermore, the known manufacturing processes lead to low yields.

Prior art scintillation materials or scintillation materials produced in the usual manner also have poor workability, which is due to their increased fracture tendency. Fracture tendency can be due to inhomogeneities in the material caused by thermal strains and also by crystal defects. The presence of thermal strains can bring about a pronounced strain birefringence of the scintillation material and also refractive index inhomogeneities. In some cases scintillation materials produced in the usual manner even exhibit considerable differences in terms of light yield, mechanical properties and behavior following after-treatment. This is particularly evident in the case of single crystal materials which show crystal-to-crystal differences in behavior. An excessive amount of oxygen in the material has a negative effect on essential properties.

After-treatment of the materials produced in the usual manner, such as separation, grinding and polishing, requires a considerable effort leading to considerable numbers of rejects which in the past have been referred to as being disadvantageous.

Major crystal-to-crystal differences in terms of scintillation properties are also viewed as being disadvantageous.

The materials and processes according to the present invention are not limited to single crystal scintillation materials and their production, although these represent special embodiments. According to the invention, it is also possible to produce and provide polycrystalline materials. Such polycrystalline structures are preferably essentially devoid of interspaces/grain boundaries, which lead to single-crystal-like properties.

Processes for producing single-crystal scintillation materials are preferred, because the processes according to the invention are capable of providing single crystals of a preferred size. When the material is polycrystalline, the individual crystals should be arranged so as to impart an isotropic behavior to the material involved.

Scintillation materials based on cerium bromide are known from the prior art, for example see U.S. Pat. No. 7,405,404 B1. The cerium bromide discussed therein can also be doped. In particular, yttrium, hafnium, zirconium, palladium and bismuth are not mentioned as dopants. Moreover, the processes for producing the single crystal scintillation materials are current processes known to those skilled in the art. Special conditions concerning the atmosphere during crystal-growing are not mentioned. The same is true for cooling conditions or cooling rates used during the manufacturing process.

EP 1 930 395 A2 describes scintillator compositions prepared from different "pre-scintillator compositions". Nothing is said about the atmosphere present during crystal growing. Annealing regimes and cooling rates are also not mentioned.

US 2008/0067391 A1 discloses, among other things, single-crystal scintillators of a certain formula. It mentions dopants in the materials and does not refer to a particular manufacturing process that would result in a material with reduced oxygen content.

SUMMARY OF THE INVENTION

Hence, a great need exists for scintillation materials with oxygen content below 2,500 ppm and for novel manufacturing processes for scintillation materials that have low oxygen content in the finished product. This content should be less than 2,500 ppm, preferably less than 1,000 ppm, and more preferably less than 500 ppm.

The application of the process should be flexible so that both single-crystalline and polycrystalline materials can be produced.

Also preferably a process should be made available that can produce large single crystals, when single crystal materials are desired. Another requirement placed on the process is that it should give a high yield of material while at the same time allowing simple handling. Moreover, the materials produced according to the invention should have the above-indicated advantageous properties, namely a low oxygen content of the material of less than 2,500 ppm, preferably less than 1,000 ppm, and more preferably less than 500 ppm.

The material should have high strength, and the process should correspondingly meet the requirement of providing materials of good mechanical strength and corresponding good after-treatment characteristics.

Moreover, the process should be flexibly usable to provide scintillation materials based on rare earth halides, for example lanthanum halides, particularly cerium bromide, these substances possibly also being doped.

The aforesaid objectives of the present invention are attained by a material and a process as described in claims appended herein below.

In particular, these objectives and others, which will be made more apparent hereinafter, are attained in a process for producing a scintillation material having an oxygen content of less than 2,500 ppm, preferably less than 1,000 ppm, and more preferably less than 500 ppm, and comprising a compound having a general empirical formula $LnX_3$ or $LnX_3$:D, wherein Ln is at least one member selected from the group consisting of Sc, Y, La, Ce, Pr, Nd, Pm, Sm, Eu, Gd, Tb, Dy, Ho, Er, Tm, Yb and Lu (rare earth elements); X is selected from the group consisting of F, Cl, Br and I; and D is at least one cationic dopant comprising one or more of the elements Y, Zr, Hf, Pd and Bi, which, if present, is contained in the material in an amount of 10 ppm to 10,000 ppm, the process comprising the steps of optionally mixing $LnX_3$ with the at least one cationic dopant to form a mixture, heating the compound of the general empirical formula $LnX_3$ or the mixture obtained by the optional mixing to a melting temperature thereof to form a melt and then cooling to obtain a single crystal or a polycrystalline structure.

According to the invention the process further comprises adding carbon-containing gases to the crystal-growing atmosphere above the melt.

Suitable carbon-containing gases are preferably carbon halides, such as $CCl_4$, $CBr_4$, $Cl_4$ and others. Depending on the crystal-growing conditions, particularly the pressure and temperature, these gases react with the oxygen in the crystal-growing atmosphere forming carbon oxyhalides which accumulate in the gaseous atmosphere and are not incorporated into the crystal. According to this process according to the invention, the crystal obtained is nearly oxygen-free, namely, as stated previously, its oxygen content is less than 2,500 ppm.

The filling with the carbon-containing gas should be chosen so that the total pressure in the ampoule at the crystal-growing temperature does not exceed 1000 hPa, but is higher than the highest partial pressure of a crystal-growing component.

Besides the atmosphere present during the crystal growing that is decisive according to the invention, optionally other conditions can be selected depending on the material to be produced. For example, the mixture can be cooled from the crystal-growing temperature to 100° C. at a rate of less than 20 K/h. Moreover, the mixture can be cooled in the temperature range from 100° C. to 25° C. at a cooling rate of less than 40 K/h and the maximum temperature gradient in the crystal should be less than 10 K/cm.

According to a special embodiment, the process comprises the following steps:
introducing the lanthanum halide optionally with or without a dopant into an appropriate ampoule;
evacuating the ampoule;
filling the ampoule with a carbon halide and optionally also with an inert gas;
optionally sealing the ampoule;
heating the ampoule and then growing a crystal or a crystalline structure;
optionally cooling at a rate of less than or equal to 20 K/h;
optionally appropriate cooling at the aforesaid rate from the crystal-growing temperature to a temperature of about 100° C.;
cooling in a temperature range from about 100° C. to 20° C. at a rate of, for example, less than 40 K/h.

Preferably the maximum temperature gradient in the crystal, provided a single crystalline material is involved, is less than 10 K/cm. According to a particularly preferred embodiment, this temperature gradient is less than 5 K/cm, and most preferably less than 2 K/cm, while at the same time the oxygen content is low as required by the invention.

The cooling rate within the temperature range between the crystal-growing temperature and about 100° C. is, according to the preferred embodiments of the process, below 10 K/h and more preferably about 5 K/h.

The rate of further cooling in a temperature range between 100° C. and 25° C. is preferably 20 K/h and more preferably 10 K/h.

The process according to the invention is generally usable for the production of a scintillation material with an oxygen content of less than or equal to 2,500 ppm and comprising a compound of formula $LnX_3$, wherein Ln is selected from the group consisting of Sc, Y, La, Ce, Pr, Nd, Pm, Sm, Eu, Gd, Tb, Dy, Ho, Er, Tm. Yb and Lu (rare earth elements), and X is F, Cl, Br or I. It is also possible to produce materials comprising $LnX_3$:D, wherein Ln and X have the aforesaid definitions and D is at least one cationic dopant comprising one or more of the elements Y, Zr, Hf, Pd and Bi, and, if present in the material, is present in an amount of 10 ppm to 10,000 ppm.

The scintillation material produced according to the invention preferably consists of the aforesaid compounds $LnX_3$ or $LnX_3$:D and has a low oxygen content.

If the process according to the invention provides doped materials, the dopant can be present in the material in an amount from 50 ppm to 5,000 ppm and preferably from 100 ppm to 10,000 ppm.

According to the invention pure cerium bromide is preferably produced by the process described herein. Also materials in which the cation is lanthanum, lutetium or praseodymium are preferred. Preferred anions are chlorine, bromine and iodine, the most preferred anions being chlorine and bromine.

According to those skilled in the art, the optionally used cooling rates can be used in the known processes for the production of single crystals, for example the Bridgman process and the Czochralski process. The starting halides, with or without dopants, are heated in the usual manner to melt them and are then cooled according to the invention to induce crystallization.

The materials obtained according to the invention distinguish themselves by, among other things, an excellent light yield. The decay time of the scintillation materials is reduced so that the reaction time is shortened.

In the case of single-crystal materials, it is possible to produce large-volume units greater than 5 $cm^3$ in size and which have the low oxygen content desired according to the invention. Moreover, the materials preferably have a low strain birefringence and outstanding refractive index uniformity.

If the materials are doped, the dopant or dopants are present in the scintillation material in an amount from 50 ppm to 10,000 ppm, preferably from 100 ppm to 5,000 ppm, and more preferably from 100 ppm to 1,000 ppm.

Because of the difference in ionic radius between dopants D and the rare earth cations, local strains are induced in the host crystal. Until now, it has been assumed that such local strains are disadvantageous. Surprisingly, however, we have found that these strains increase the lattice energy to an extent such that the critical energy for fissuring or fissure propagation is clearly increased.

During the crystal-growing process, these local strains result in fewer structural crystal defects. The thermal strains caused by the temperature gradients needed for crystal-growing are not removed by defects (elastic and not plastic strain degradation). This leads to a lower thermal straining Moreover, the lower defect concentrations lead to a reduction in the non-radiative transitions and thus to an increase in light yield or light output, and particularly without exerting a negative effect on the other scintillation properties, such as the decay time and the energy resolution. A dopant D can be present in the scintillation material produced according to the invention in an amount from 500 ppm to 5,000 ppm. A dopant amount of 100 ppm, preferably higher than 500 ppm, or up to the upper limit of 1,000 ppm is particularly preferred.

It has been found that the scintillation material produced according to the invention has particularly advantageous properties when the rare earth element, Ln, which is present in cationic form, is La, Ce, Lu, Pr, or Eu. Preferably Ln is La or Ce.

Quite preferably, the anion X is Cl, Br, or I, and even more preferably is Cl or Br. Most preferably, the scintillation material according to the invention is doped $CeBr_3$.

Doped lutetium iodide and doped lanthanum bromide are also preferably produced according to the present invention.

Scintillation materials of the aforesaid compositions with the dopants according to the invention and produced according to the invention are outstanding, because of their pronounced hardness—even at temperatures close to their melting point. As a result, fewer crystal defects are created and fewer strains are generated.

In the performance of the process of the invention, it is possible to use a uniform temperature of at the most 10 K, preferably 50 K, and more preferably 100 K, below the melting temperature of the material during the annealing. In this case the temperature gradient is less than 2 K/cm, preferably less than 1 K/cm, and most preferably less than 0.5 K/cm. The melting and cooling rates during the annealing are to be chosen as in the cooling process.

The scintillation material thus obtained is outstanding not only for its low oxygen content, but also because it has a strain birefringence of less than 1 μm/cm, preferably less than 50 nm/cm and most preferably less than 10 nm/cm. Appropriate annealing clearly improves not only the strain birefringence, but also the refractive index uniformity. Thus, PV values better than $\Delta n=10^{-3}$ can be achieved. To those skilled in the art "PV" means the maximum observed difference in refractive index. PV is an abbreviation for "peak to valley". abbreviation for "peak to valley".

According to the invention the background radiation of the scintillation material preferably amounts to less than 0.5 $Bq/cm^3$, which is made possible by the high purity of the material. Impurities contributing to the radioactive background radiation can also be avoided by an appropriate choice of the starting compounds.

EXAMPLES

The following examples explain the invention and are not intended to limit its scope.

Example 1

To prepare a material according to the invention, in a glove box filled with argon, 500 g of cerium bromide and 0.5 g of $CBr_4$ were weighed out into a quartz ampoule having an internal diameter of 30 mm, with water and oxygen present in the atmosphere in an amount of less than 5 ppm. The ampoule was then evacuated, filled with argon to 50 mbar and sealed. A 30 mm-long capillary with an internal diameter of 3 mm was inserted into the tip of the ampoule. The ampoule was placed into a 3-zone Bridgman furnace. At first, the temperature was kept at 780° C. for 48 h. A crystal was then grown at a withdrawing rate of 1 mm/h and then cooled from the crystal-growing temperature to a temperature of 100° C. at a cooling rate of less than 10 K/h. The cooling rate was then adjusted to less than 20 K/h until the room temperature was reached. Throughout the entire crystal-growing process, the temperature gradient in the crystal was less than 5 K/cm.

The ampoule was then opened in the glove box, and the crystal was removed.

Example 2

To prepare a material according to the invention, in a glove box filled with argon, 500 g of cerium bromide, 0.26 g of $BiBr_3$ (corresponding to 0.125 g of bismuth) and 0.29 g of $HfBr_3$ (corresponding to 0.125 g of hafnium) were weighed out into a quartz ampoule having an internal diameter of 30 mm, with water and oxygen present in the atmosphere in an amount of less than 5 ppm. The ampoule was then evacuated, filled with argon to 50 mbar and sealed. A 30 mm-long capillary with an internal diameter of 3 mm was inserted into the tip of the ampoule. The ampoule was placed into a 3-zone Bridgman furnace. At first, the temperature was kept at 780° C. for 48 hours. A crystal was then grown at a withdrawing rate of 1 mm/h. The crystal was then cooled from the crystal-growing temperature to a temperature of 100° C. at a cooling rate of less than 10 K/h. The cooling rate was then adjusted to less than 20 K/h until the room temperature was reached. Throughout the entire crystal-growing process, the temperature gradient in the crystal was less than 5 K/cm.

The ampoule was then opened in the glove box, and the crystal was removed.

While the invention has been illustrated and described as embodied in a scintillation materials of low oxygen content and process for producing same, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A scintillation material with a maximum oxygen content of 2,500 ppm and comprising a compound of general empirical formula $LnX_3$:D, wherein Ln is at least one element selected from the group consisting of Sc, Y, La, Ce, Pr, Nd, Pm, Sm, Eu, Gd, Tb, Dy, Ho, Er, Tm, Yb, and Lu; X is Cl, Br, or I; and D is at least one cationic dopant comprising of one or more of Zr, Hf, Pd, and Bi and is present in an amount of 10 ppm to 10,000 ppm;

wherein said scintillation material is made by a process comprising the steps of:
a) optionally mixing a compound of the general empirical formula $LnX_3$ with the at least one cationic dopant to form a compound having the general empirical formula $LnX_3$:D, or otherwise providing a compound of the general empirical formula $LnX_3$:D;

b) heating the compound of the general empirical formula $LnX_3$:D to a melting temperature thereof to form a melt;

c) adding at least one carbon-containing compound to the compound or to an atmosphere above the melt; and d) cooling the melt to obtain a single crystal or a polycrystalline structure.

2. The scintillation material according to claim 1, wherein the maximum oxygen content is 1,000 ppm.

* * * * *